United States Patent
Cho et al.

(10) Patent No.: US 8,059,022 B2
(45) Date of Patent: Nov. 15, 2011

(54) DIGITAL-TO-ANALOG CONVERTER

(75) Inventors: Young Kyun Cho, Daejeon (KR); Young Deuk Jeon, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/773,768

(22) Filed: May 4, 2010

(65) Prior Publication Data

US 2011/0032134 A1 Feb. 10, 2011

(30) Foreign Application Priority Data

Aug. 7, 2009 (KR) .................. 10-2009-0072660

(51) Int. Cl.
*H03M 1/66* (2006.01)
(52) U.S. Cl. ......... 341/150; 341/155; 341/144; 341/172
(58) Field of Classification Search .................. 341/172, 341/144, 155, 156, 150
See application file for complete search history.

(56) References Cited

U.S. PATENT DOCUMENTS

| | | | | |
|---|---|---|---|---|
| 5,621,409 A | * | 4/1997 | Cotter et al. | 341/156 |
| 5,684,487 A | * | 11/1997 | Timko | 341/172 |
| 6,400,302 B1 | * | 6/2002 | Amazeen et al. | 341/172 |
| 6,486,806 B1 | | 11/2002 | Munoz et al. | |
| 6,667,707 B2 | | 12/2003 | Mueck et al. | |
| 6,686,865 B2 | * | 2/2004 | Confalonieri et al. | 341/172 |
| 7,015,841 B2 | | 3/2006 | Yoshida et al. | |
| 7,023,372 B1 | * | 4/2006 | Singh et al. | 341/155 |
| 7,286,075 B2 | | 10/2007 | Hennessy et al. | |
| 2003/0206038 A1 | * | 11/2003 | Mueck et al. | 327/50 |
| 2007/0115159 A1 | * | 5/2007 | Tachibana et al. | 341/144 |

FOREIGN PATENT DOCUMENTS

| | | |
|---|---|---|
| KR | 1020010008374 A | 2/2001 |
| KR | 1020070030002 A | 3/2007 |
| KR | 100801962 B1 | 1/2008 |

OTHER PUBLICATIONS

Pierangelo Confalonieri et al., "A 2.7mW 1MSps 10b Analog-to-Digital Converter with Built-in Reference Buffer and 1LSB Accuracy Programmable Input Ranges," Solid-State Circuits Conference, 2004, pp. 255-258, 2004 IEEE. Franz Kuttner, "A 1.2V 10b 20MSample/s Non-Binary Successive Approximation ADC in 0.13μm CMOS," IEEE International Solid-State Circuits Conference, 2002, 2002 IEEE.
Jens Sauerbrey et al., "A 0.5-V 1-μW Successive Approximation ADC," IEEE Journal of Solid-State Circuits, Jul. 2003, p. 1261-1265, vol. 38, No. 7, 2003 IEEE.
Young-Kyun Cho et al., "A 9-bit 80-MS/s Successive Approximation Register Analog-to-Digital Converter with Capacitor Reduction Technique," pp. 1-5, IEEE.

* cited by examiner

*Primary Examiner* — Jean Jeanglaude

(57) ABSTRACT

A digital-to-analog converter (DAC) is provided. The DAC includes a positive converter, a negative converter, and a comparator for receiving outputs of the positive converter and the negative converter, comparing the outputs with a reference voltage, and generating an output voltage. Each of the positive converter and the negative converter includes an upper-bit converter including a plurality of bit capacitors corresponding to respective upper bits, a lower-bit converter including a plurality of bit capacitors corresponding to respective lower bits, and a coupling capacitor for connecting the upper-bit converter with the lower-bit converter in series. Each of the positive converter and the negative converter receives a bias voltage to have a uniform offset when converting the respective bits. Accordingly, it is possible to obtain a high resolution using a small area. Also, the number of capacitors can be reduced, and the capacitance of a unit capacitor can be maximized. Consequently, it is possible to minimize heat noise and device mismatching.

7 Claims, 3 Drawing Sheets

FIG. 4
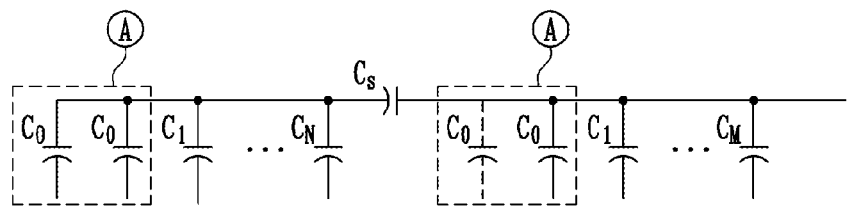
FIG. 5
| | @ Sampling | @ After Sampling | @ Conversion (H) | @ Conversion (L) |
|---|---|---|---|---|
| $M_{0,N}$ | INB | CM | REFN | CM |
| $M_{0,p}$ | IN | CM | CM | REFN |
| $L_{0,N}$ | CM | REFN | REFN | CM |
| $L_{0,p}$ | CM | CM | REFP | CM |
FIG. 6
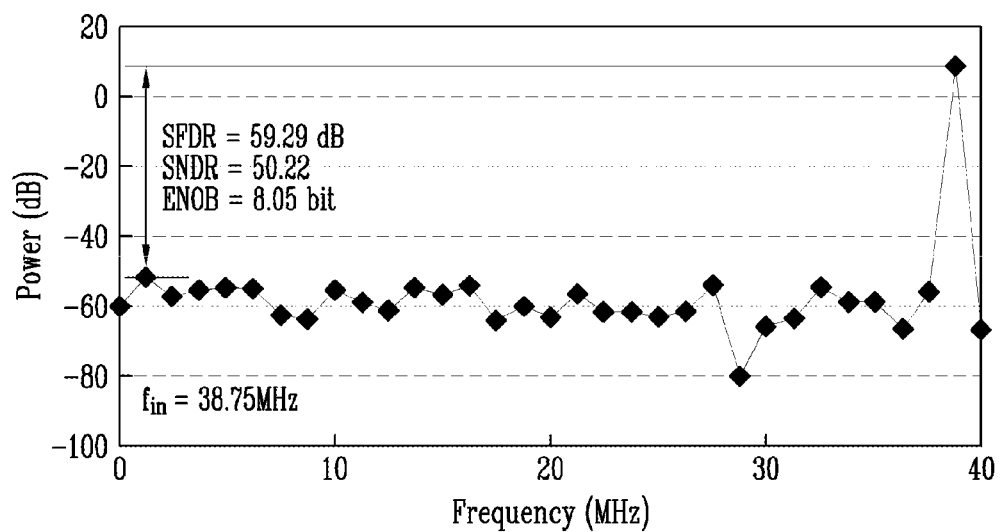

DIGITAL-TO-ANALOG CONVERTER

CROSS-REFERENCE TO RELATED APPLICATION

This application claims priority to and the benefit of Korean Patent Application No. 10-2009-0072660, filed Aug. 7, 2009, the disclosure of which is incorporated herein by reference in its entirety.

BACKGROUND

1. Field of the Invention

The present invention relates to a digital-to-analog converter (DAC), and more particularly to a DAC used in successive approximation register (SAR) analog-to-digital converters (ADCs).

2. Discussion of Related Art

Lately, SAR ADCs have been attracting attention in an area having an 8 to 16-bit resolution and a 5 to 100-MS/s conversion rate. Also, due to SAR ADCs' primary advantage of low power consumption, SAR ADCs are rising as a next-generation high-efficiency data converter.

SAR ADCs employ a method of searching for a digital output value closest to an input while fixing the input and sequentially changing a reference voltage. Thus, SAR ADCs must be able to precisely perform such a process.

FIG. 1 is a circuit diagram of a conventional ADC having a DAC.

For detailed comparison and analysis, a DAC having a 5-bit resolution will be representatively described.

Referring to FIG. 1, a SAR ADC includes a logic unit, a positive DAC PDAC, a negative DAC NDAC, and a comparator AMP.

The positive DAC PDAC and the negative DAC NDAC sample analog inputs IN and INB, receive a reference voltage according to a digital signal of the logic unit, and generate input voltages for the comparator AMP.

The comparator AMP receives the input voltages from the positive DAC PDAC and the negative DAC NDAC, compares the input voltages, and generates a "low" or "high" output signal $V_{OUT}$.

The logic unit stores the output signal $V_{OUT}$ of the comparator AMP and uses it as a next operation control signal of the positive DAC PDAC and the negative DAC NDAC.

In other words, the positive DAC PDAC and the negative DAC NDAC generate the input voltages of the comparator AMP according to a digital signal of a previous bit applied from the logic unit.

The DACs PDAC and NDAC of FIG. 1 have the general DAC structure, which includes binary weighted capacitors.

To be specific, a most significant bit (MSB) capacitor has a capacitance $C_4=2*C_3=4*C_2=8*C_1=16*C_0$, and a capacitor $C_0$ at the left end is an offset compensation capacitor that can be removed.

Operation of the SAR ADC including the binary weighted capacitor DACs PDAC and NDAC of FIG. 1 will now be described. First, all capacitors are connected with the analog input IN or INB at an input sampling phase.

Thus, when sampling is finished, the analog inputs IN and INB are stored in the capacitors of the positive and negative DACs PDAC and NDAC.

Here, to reduce an offset between the DACs PDAC and NDAC occurring during the sampling, electrodes connected with the top plate of the capacitor arrays of the DACs PDAC and NDAC can be connected with each other through a switch (not shown) using a prime clock, electrodes being connected to the input terminals of the comparator AMP.

When the input analog signal is sampled in the DACs PDAC and NDAC, the logic unit sets a MSB D4 to 1 and other bits to 0 and compares the sampled values with an intermediate code (10000).

To be specific, the bottom plate of the capacitor $C_4$ of the positive DAC PDAC corresponding to the MSB is connected with a positive reference voltage REFP, the bottom plate of the capacitor $C_4$ of the negative DAC NDAC is connected with a negative reference voltage REFN, other capacitors are reversely connected, and then the voltage levels of the two input voltages are compared with the level of a reference voltage by the comparator AMP.

When the comparator AMP compares the input voltages with the reference voltage and outputs the "high" or "low" output signal $V_{OUT}$, the logic unit determines the output signal $V_{OUT}$ as the final MSB D4 and stores it.

Also, the logic unit repeats a conversion operation for determining a bit D3 after the MSB D4 is determined, and determines other bits using a general successive approximation method.

Such a DAC using binary weighted capacitors requires 32 unit capacitors to have a 5-bit resolution, and a logic unit must perform a successive approximation operation six times to obtain a whole 5-bit digital signal.

SUMMARY OF THE INVENTION

The present invention is directed to providing a digital-to-analog converter (DAC) that uses capacitor arrays and can operate using only a small number of unit capacitors.

One aspect of the present invention provides a DAC including: a positive converter; a negative converter; and a comparator receiving outputs of the positive converter and the negative converter, comparing the outputs with a reference voltage, and generating an output voltage. Here, each of the positive converter and the negative converter includes: an upper-bit converter including a plurality of bit capacitors corresponding to respective upper bits; a lower-bit converter including a plurality of bit capacitors corresponding to respective lower bits; and a coupling capacitor connecting the upper-bit converter with the lower-bit converter in series, and receives a bias voltage to have a uniform offset when converting the respective bits.

The bit capacitors may be formed by merging two unit capacitors.

The bias voltage may be a positive reference voltage, a negative reference voltage, or a common-mode voltage.

During pseudo-differential driving, voltages having different absolute values may be applied to the positive converter and the negative converter to have the uniform offset when the respective bits are converted.

Each of the upper-bit converter and the lower-bit converter may be a binary weighted capacitor.

The upper-bit converter may receive a sampling voltage and may be sampled, and the lower-bit converter may not receive the sampling voltage.

The pseudo-differential driving may be performed after the upper-bit converter is sampled, when the upper-bit converter converts a last bit, and when the lower-bit converter converts a last bit.

The bias voltage applied during the pseudo-differential driving may be determined according to a converted previous bit.

From the viewpoint of the upper-bit converter, a circuit including the coupling capacitor and the lower-bit converter has a capacitance of a unit capacitor.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 4 shows a circuit design of separated and merged capacitors according to an exemplary embodiment of the present invention;

FIG. 5 is a table of pseudo-differential driving according to an exemplary embodiment of the present invention; and FIG. 6 shows the simulation result of a 9-bit 80-MS/s SAR ADC employing a DAC according to an exemplary embodiment of the present invention.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

Throughout this specification, when an element is referred to as being "connected" or "coupled" to another element, it can be directly connected or coupled to the other element or intervening elements may be present.

As used herein, the terms " . . . unit," " . . . device," " . . . module," etc., indicate a unit that performs at least one function or operation and can be implemented by hardware, software, or a combination thereof.

To reduce the number of unit capacitors, a digital-to-analog converter (DAC) according to an exemplary embodiment of the present invention calculates a most significant bit (MSB) by applying a common-mode voltage after sampling, has a structure separated by a coupling capacitor, and merges two unit capacitors into one.

Here, pseudo-differential driving is performed to keep an occurrable offset the same while all bits are calculated.

The DAC according to an exemplary embodiment of the present invention will be described below with reference to FIG. 2.

Figure 2:
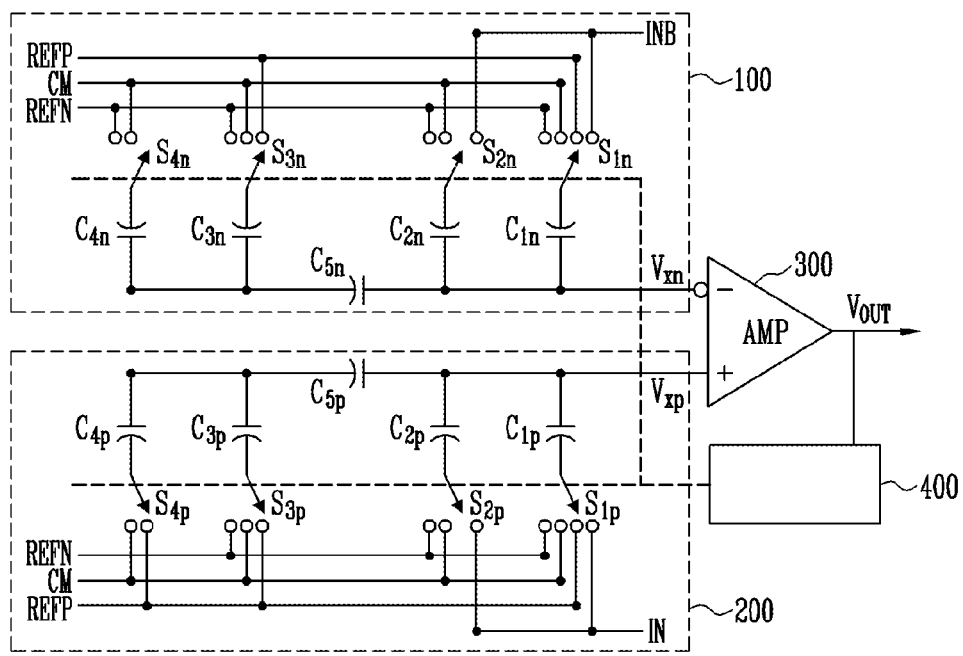
FIG. 2 is a circuit diagram of a successive approximation register (SAR) ADC including a DAC having a pseudo-differentially-driven merged capacitor switching structure according to an exemplary embodiment of the present invention.

FIG. 2 is a circuit diagram of a successive approximation register (SAR) analog-to-digital converter (ADC) including a DAC having a pseudo-differentially-driven merged capacitor switching structure according to an exemplary embodiment of the present invention.

As in FIG. 1, a 5-bit DAC will be described as an example for convenience with reference to FIG. 2.

The SAR ADC according to an exemplary embodiment of the present invention includes a positive DAC 200, a negative DAC 100, a comparator 300, and a logic unit 400.

Operation of the comparator 300 and the logic unit 400 is similar to that of FIG. 1, and thus the DACs 100 and 200 will be described.

The negative DAC 100 and the positive DAC 200 have the same structure, and each includes four bit capacitors C1n, C2n, C3n, and C4n/C1p, C2p, C3p, and C4p, one coupling capacitor C5n/C5p, and four switching devices S1n, S2n, S3n, and S4n/S1p, S2p, S3p, and S4p.

The bottom plates of the four bit capacitors C1n, C2n, C3n, and C4n/C1p, C2p, C3p, and C4p are connected with the switching devices S1n, S2n, S3n, and S4n/S1p, S2p, S3p, and S4p, respectively. The switching devices S1n, S2n, S3n, and S4n/S1p, S2p, S3p, and S4p selectively connect the bottom plates of the connected bit capacitors C1n, C2n, C3n, and C4n/C1p, C2p, C3p, and C4p with a positive reference voltage REFP, a negative reference voltage REFN, a common-mode voltage CM, or an analog input voltage INB/IN.

The four bit capacitors C1n, C2n, C3n, and C4n/C1p, C2p, C3p, and C4p are classified into upper-bit capacitors and lower-bit capacitors.

When a 5-bit (D4:D0) digital signal is converted according to an exemplary embodiment of the present invention, three preceding bits are classified as upper bits, and the two following bits are classified as lower bits.

Thus, the top plates of the bit capacitors C1n and C2n/C1p and C2p for two upper bits (D3; D2) excluding the most significant bit (MSB) calculation based on connection with the common-mode voltage CM are connected with input terminals of the comparator 300.

Meanwhile, the top plates of the two bit capacitors C3n and C4n/C3p and C4p for lower bits (D1; D0) are also connected with each other, and the coupling capacitor C5n/C5p is formed between the top plates of the lower-bit capacitors C3n and C4n/C3p and C4p and the top plates of the upper-bit capacitors C1n and C2n/C1p and C2p.

Here, the analog input voltage INB/IN can be connected only to the bottom plates of the upper-bit capacitors C1n and C2n/C1p and C2p.

To be specific, the negative DAC 100 may receive the negative analog input voltage INB, which is an opposite polarity voltage of the positive analog input voltage IN, at the bottom plates of the upper-bit capacitors C1n and C2n, and the top plates of the upper-bit capacitors C1n and C2n are connected with a negative input terminal of the comparator 300.

The positive DAC 200 may receive the positive analog input voltage IN at the bottom plates of the upper-bit capacitors C1p and C2p, and the top plates of the upper-bit capacitors C1p and C2p are connected with a positive input terminal of the comparator 300.

Available connections between capacitors and voltages through the switching devices S1n, S2n, S3n, and S4n in the positive DAC 200 are opposite to those through the switching devices S1p, S2p, S3p, and S4p in the negative DAC 100.

Here, from the viewpoint of the upper-bit capacitors C1n and C2n/C1p and C2p, the circuit including the coupling capacitor C5n/C5p and the lower-bit capacitors C3n and C4n/C3p and C4p has a total capacitance of 1 C.

The upper-bit capacitors C1n and C2n/C1p and C2p and the lower-bit capacitors C3n and C4n/C3p and C4p separated by the coupling capacitor C5n/C5p separately perform binary weighted capacitor digital-to-analog conversion such that the number of unit capacitors can be remarkably reduced.

Figure 1:
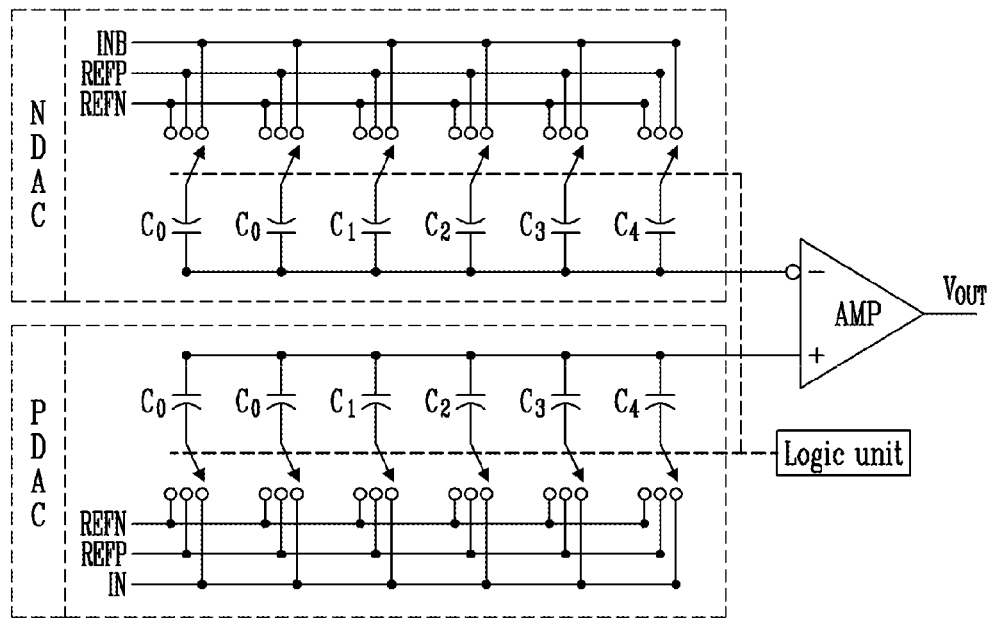
FIG. 1 is a circuit diagram of a conventional analog-to-digital converter (ADC) having a digital-to-analog converter (DAC)

To be specific, the capacitance of the MSB capacitor of FIG. 1 is 16 C, while the capacitance of the MSB capacitor in one group is 2 C in an exemplary embodiment of the present invention because MSB calculation is performed by the common-mode voltage CM and the other four bits are divided into two groups by the coupling capacitor C5n/C5p.

The lower-bit capacitors C3n and C4n/C3p and C4p include an offset compensation capacitor for compensating for an offset and thus have a total capacitance of 4 C, and the upper-bit capacitors C1n and C2n/C1p and C2p have a total capacitance of 3 C. Here, when the capacitors are merged to have a capacitance of 2 C, the total number of capacitors can be remarkably reduced.

To this end, the total capacitance value of the upper-bit capacitors C1n and C2n/C1p and C2p must be an even number, and thus capacitances of 1 C are added such that the total capacitance becomes 4 C.

For this reason, the four bit capacitors C1n, C2n, C3n, and C4n/C1p, C2p, C3p, and C4p of FIG. 2 are formed to be unit capacitors having a capacitance of 2 C, and the coupling capacitor C5n/C5p has a capacitance of 4/3 C.

As described above, since the common-mode voltage CM is applied to the DACs 100 and 200 after sampling, there is no capacitor for the MSB D4, and the number of capacitors is reduced to the half of that in FIG. 1.

Also, the coupling capacitor C5n/C5p separates the capacitors into upper-bit capacitors and lower-bit capacitors to reduce a capacitance, and merges the separated capacitors two by two to reduce the number of unit capacitors.

Here, pseudo-differential driving is performed to keep an offset the same when respective bits are calculated wherein the offset occurs due to the capacitance of 1C added for merging capacitances.

First, in an input sampling mode, the bottom plates of the upper-bit capacitors C1n and C2n/C1p and C2p are connected with the analog input voltage INB/IN, and the bottom plates of the lower-bit capacitors C3n and C4n/C3p and C4p are connected with the common-mode voltage CM.

Thus, in the input sampling mode, the lower-bit capacitors C3n and C4n/C3p and C4p have no influence on operation of the circuit, and only the upper-bit capacitors C1n and C2n/C1p and C2p participate in sampling.

At this time, the total amount of sampled electric charge is as shown in Equation 1.

$$Q_\Sigma = 4C \times V\text{in} \quad \text{[Equation 1]}$$

Here, Vin is equal to a difference between the two analog input voltages INB and IN (IN−INB).

When sampling is finished, the top plates of the sampled upper-bit capacitors C1n and C2n/C1p and C2p are first floated by a prime clock (not shown).

At this time, all the capacitors except for the lowermost-bit capacitor C4n in the negative DAC 100 are connected with the common-mode voltage CM, and the bottom plate of the lowermost-bit capacitor C4n is connected with the negative reference voltage REFN.

In other words, the first pseudo-differential driving in which different levels of voltages are applied to both of the lowermost-bit capacitor C4n/C4p of the DACs 100 and 200 is performed.

After such connections, the total amounts of electric charge at the input terminals of the comparator 300 are as shown in Equation 2.

$$Q_X Q_{Xp} - Q_{Xn} = -5V_X + 1/4 V\text{ref} \quad \text{[Equation 2]}$$

Here, Vref is equal to a difference between the two reference voltages (REFP−REFN).

Since the total amount of electric charge of the capacitors is fixed, a voltage $V_X$ at the input terminals is calculated as shown in Equation 3 using Equations 1 and 2.

$$V_{x,1} = -4/5 V\text{in} + 1/20 V\text{ref} \quad \text{[Equation 3]}$$

The voltage $V_X$ at the input terminals of the comparator 300 is different from that of a general DAC.

A general DAC satisfies $V_{x,1} = -V\text{in}$ after sampling. On the other hand, a DAC according to an exemplary embodiment of the present invention operates with a direct current (DC) offset of 1/20 Vref.

The general DAC determines whether or not $V_{x,1}$ is larger than 0, while the DAC according to an exemplary embodiment of the present invention determines whether or not −4/5Vin+1/20Vref is larger than 0.

Such an offset does not cause malfunction of a circuit, and can be easily removed by the comparator 300 at the rear end or through a technique for compensating for the offset of the entire ADC.

At this time, the offset must be kept the same while all bits are calculated such that the circuit can normally operate. Thus, to keep the offset the same, pseudo-differential driving is also performed when the next bit is calculated.

When the output of the comparator 300 has a "high" value according to $V_{x,1}$ in calculation of the first bit, and thus D4=1, the bottom plate of the first capacitor C1p of the positive DAC 200 is connected with the positive reference voltage REFP, the bottom plate of the first capacitor C1n of the negative DAC 100 is connected with the negative reference voltage REFN, and other capacitors are kept in their previous states. In this situation, the total amount of electric charge is as shown in Equation 4.

$$Q_X = -5V_X 2V\text{ref} + 1/4 V\text{ref} \quad \text{[Equation 4]}$$

Referring to Equations 2 and 4, according to the conservation law of electric charge, a voltage $V_{x,2}$ at the input terminals of the comparator 300 is as shown in Equation 5.

$$V_{x,2} = -4/5 V\text{in} + 2/5 V\text{ref} + 1/20 V\text{ref} \quad \text{[Equation 5]}$$

The voltage $V_{x,2}$ for the second bit at the input terminals of the comparator 300 has a similar form to a voltage ($V_{x,2}$=−Vin+1/2Vref) that a general DAC has after conversion of the first bit, and has the same offset of 1/20 Vref as the voltage $V_{x,1}$ at the input terminals during conversion of the first bit.

Subsequently, the second pseudo-differential driving is performed.

When the output of the comparator 300 according to the voltage $V_{x,2}$ for the second bit at the input terminals is larger than 0, D3=0, the bottom plate of the second capacitor C2p of the positive DAC 200 is connected with the negative reference voltage REFN, and the bottom plate of the second capacitor C2n of the negative DAC 100 is connected with the common-mode voltage CM.

On the other hand, when the output of the comparator 300 according to the voltage $V_{x,2}$ for the second bit at the input terminals is smaller than 0, D3=1, the bottom plate of the second capacitor C2p of the positive DAC 200 is connected with the common-mode voltage CM, and the bottom plate of the second capacitor C2n of the negative DAC 100 is connected with the negative reference voltage REFN.

In this situation, a voltage $V_{x,3}$ at the input terminals of the comparator 300 is as shown in Equation 6.

$$V_{x,3} = -4/5 V\text{in} + 1/5 V\text{ref} + 1/20 V\text{ref} \quad \text{[Equation 6]}$$

Here, when $V_{x,3}$ is smaller than 0, D2=1, the bottom plate of the third capacitor C3p of the positive DAC 200 is connected with the positive reference voltage REFP, and the bottom plate of the third capacitor C3n of the negative DAC 100 is connected with the negative reference voltage REFN.

In this situation, a voltage $V_{x,4}$ at the input terminals of the comparator 300 is as shown in Equation 7.

$$V_{x,4} = -4/5 Vin + 1/10 Vref + 1/20 Vref \quad \text{[Equation 7]}$$

Here, when $V_{x,4}$ is larger than 0, D1=0, the bottom plates of the fourth capacitors C4p and C4n of the positive DAC 200 and the negative DAC 100 are connected with the common-mode voltage CM.

On the other hand, when $V_{x,4}$ is smaller than 0, D1=1, the bottom plate of the fourth capacitor C4p of the positive DAC 200 is connected with the positive reference voltage REFP, and the bottom plate of the fourth capacitor C4n of the negative DAC 100 is connected with the negative reference voltage REFN.

At this time, the third pseudo-differential driving is performed.

In this situation, a voltage $V_{x,5}$ at the input terminals of the comparator 300 is as shown in Equation 8.

$$V_{x,5} = -4/5 Vin + 5/20 Vref + 1/20 Vref \quad \text{[Equation 8]}$$

The lowermost bit D0 is determined by the voltage $V_{x,5}$.

In this way, pseudo-differential driving keeps an offset the same while all bits are calculated such that the offset can be removed, and enables the design of a DAC having the minimum number of capacitors.

Such pseudo-differential driving is not performed every time a bit is calculated, but is performed after sampling of an analog input voltage, when the bit of the last capacitor C2n/C2p between the upper-bit capacitors C1n and C2n/C1p and C2p is calculated, and when the bit of the last capacitor C4n/C4p between the lower-bit capacitors C3n and C4n/C3p and C4p is calculated.

As described above, pseudo-differential driving is performed on some bits instead of full-differential driving, thereby enabling analog conversion with a high resolution using a much smaller number of capacitors than those of FIG. 1. Such a difference in the number of capacitors increases as the resolution increases.

For example, for 10-bit conversion, 24 unit capacitors and 1 coupling capacitor are used.

The circuit of FIG. 2 is intended to verify a specific bias operation, and a bias condition of the pseudo-differentially-driven merged capacitor switching structure may vary.

Thus, a circuit can be configured in a bias condition that is not described herein.

Figure 3:
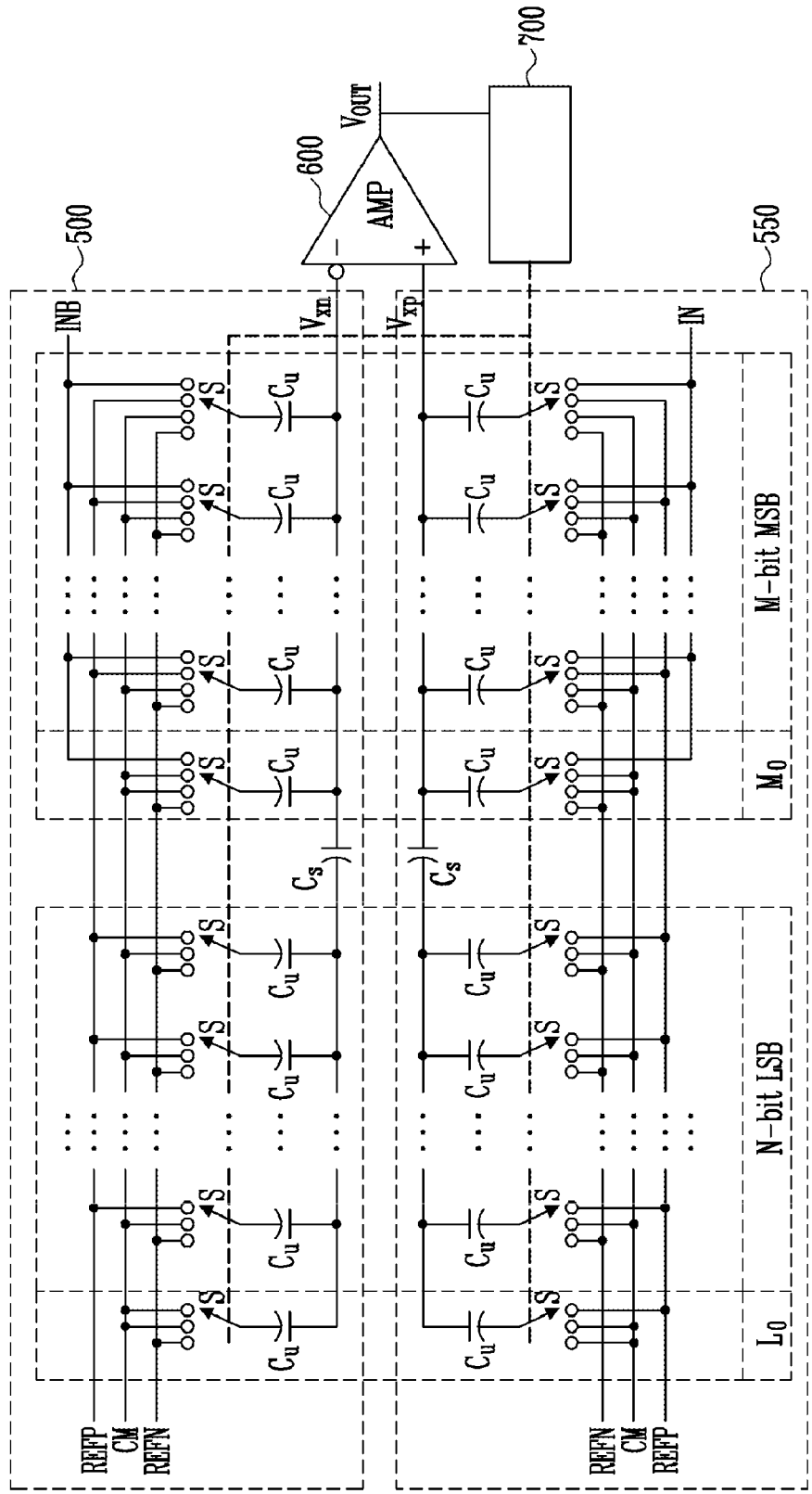
FIG. 3 is a circuit diagram of a DAC for general pseudo-differential driving according to an exemplary embodiment of the present invention.

FIG. 3 is a circuit diagram of a DAC for general pseudo-differential driving according to an exemplary embodiment of the present invention, FIG. 4 shows a circuit design of separated and merged capacitors according to an exemplary embodiment of the present invention, and FIG. 5 is a table of pseudo-differential driving according to an exemplary embodiment of the present invention.

FIG. 3 illustrates a circuit in which digital-to-analog conversion is performed on a digital signal. As in FIG. 2, the circuit includes a comparator 600, a logic unit 700, a positive DAC 550, and a negative DAC 500.

The positive DAC 550 and the negative DAC 500 are symmetrically formed, and include the same number of capacitors Cu.

In each of the DACs 500 and 550, an upper-bit capacitor array M-bit MSB and a lower-bit capacitor array N-bit MSB are connected by a coupling capacitor Cs.

The respective capacitors of the DACs 500 and 550 are formed by merging unit capacitors two by two and have the same capacitance. An analog input voltage IN/INB is sampled only by the upper-bit capacitor array M-bit MSB.

Referring to FIG. 4, as mentioned above, the upper-bit capacitor array and the lower-bit capacitor array are separated by the coupling capacitor Cs, and separately perform binary weighted capacitor conversion. To apply the merged-capacitor technique, a unit capacitor as shown in A of the upper-bit capacitor array is added and the input voltages are sampled only on the MSB side for maintaining the sampling value. Thus, the split-capacitor arrays with the merged-capacitor technique according to the embodiment of the present invention merges two unit capacitors into one both in the MSB and LSB sides and the number of unit capacitors required in split-capacitor arrays with the merged-capacitor technique are reduced by about 50%.

The DAC that is designed by merging two unit capacitors into one as mentioned above performs pseudo-differential driving to compensate for an offset caused by the added unit capacitor $C_0$ as shown in FIG. 5.

To be specific, the analog input voltages INB and IN are applied to upper-bit capacitors $K_{O,N}$ and $M_{O,P}$ during sampling, and pseudo-differential driving is performed after sampling, when the lowermost bit of the upper-bit capacitor array $M_{O,N}$ and $M_{O,P}$ is converted, and when the lowermost bit of the lower-bit capacitor array $L_{O,N}$ and $L_{O,P}$ is converted.

As shown in FIG. 5, when, for example, the lowermost bit among upper bits is converted, and a previous bit value is 1, the common-mode voltage CM is applied to the positive DAC as a pseudo-differential driving voltage, and the negative reference voltage REFN is applied to the negative DAC as a pseudo-differential driving voltage. When the previous bit value is 0, the negative reference voltage REFN is applied to the positive DAC as a pseudo-differential driving voltage, and the common-mode voltage CM is applied to the negative DAC as a pseudo-differential driving voltage.

Meanwhile, in a DAC employing the method of separating capacitors using a coupling capacitor, a very large error occurs when the value of the coupling capacitor is inaccurate, and thus a compensation capacitor may be additionally included in a lower-bit area.

Since there are other answers than those shown in FIG. 5, pseudo-differential driving can be performed by other methods as well as the method suggested in FIG. 5.

An offset between DACs kept the same by pseudo-differential driving can be removed by a method of removing an offset of a comparator.

FIG. 6 shows the simulation result of a 9-bit 80-MS/s SAR ADC employing a DAC according to an exemplary embodiment of the present invention.

FIG. 6 shows the result of sampling a 39.85-MHz analog input using an 80-MS/s clock and converting the sampled input into a digital signal. The result was obtained by reconverting a final output signal of an ADC into an analog signal using an ideal DAC and performing a fast Fourier transform (FFT) on the analog signal. The FFT was performed on a 64-bit output signal. The result shows typical operation characteristics of the entire circuit including the linearity of an amplifier, clock timing of a switched-capacitor structure, characteristics of a digital circuit, etc., but no mismatching element of a passive device.

It can be seen from the simulation result that an input signal maintains 8 or more-bit linearity at an operating speed of 80 MS/s until a Nyquist frequency. In other words, when a SAR ADC is implemented using a DAC according to an exemplary embodiment of the present invention, it is possible to implement a high-resolution/high-speed ADC in a very small area.

Using a DAC having a small area according to an exemplary embodiment of the present invention, it is possible to obtain a high resolution. Also, it is possible to reduce the number of capacitors, and the capacitance of a unit capacitor can be maximized. Consequently, heat noise and device mismatching can be minimized. Furthermore, when the DAC according to an exemplary embodiment of the present invention is used in a SAR ADC, the speed of the DAC can increase, and operating characteristics can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A digital-to-analog converter (DAC) comprising:
   a positive converter;
   a negative converter; and
   a comparator configured to receive outputs of the positive converter and the negative converter, compare the outputs with a reference voltage, and generate an output voltage,
   wherein each of the positive converter and the negative converter receives a bias voltage to have a uniform offset when converting respective bits and comprises:
      an upper-bit converter including a plurality of bit capacitors corresponding to respective upper bits;
      a lower-bit converter including a plurality of bit capacitors corresponding to respective lower bits; and
      a coupling capacitor connecting the upper-bit converter with the lower-bit converter in series,
   wherein each of the bit capacitors has substantially the same capacitance, and
   wherein the bias voltage is selected from a positive reference voltage, a negative reference voltage, and a common-mode voltage.

2. The DAC of claim 1, wherein each of the bit capacitors is formed by merging two unit capacitors.

3. The DAC of claim 1, wherein, from the viewpoint of the upper-bit converter, a circuit including the coupling capacitor and the lower-bit converter has a capacitance of a unit capacitor.

4. The DAC of claim 1, wherein during pseudo-differential driving, voltages having different absolute values are applied to the positive converter and the negative converter, respectively, to have the uniform offset when the respective bits are converted.

5. The DAC of claim 4, wherein the upper-bit converter is configured to receive a sampling voltage and to be sampled, and the lower-bit converter is configured not to receive the sampling voltage.

6. The DAC of claim 4, wherein the pseudo-differential driving is performed when the upper-bit converter and the lower-bit converter convert their last bits, respectively, after the upper-bit converter is sampled.

7. The DAC of claim 6, wherein the bias voltage applied during the pseudo-differential driving is determined according to a converted previous bit.

* * * * *